United States Patent
Ikeda et al.

(10) Patent No.: US 6,676,306 B2
(45) Date of Patent: Jan. 13, 2004

(54) LIGHT SOURCE HAVING PLURAL LASER DIODE MODULES

(75) Inventors: Masami Ikeda, Tokyo (JP); Shinya Nagamatsu, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 68 days.

(21) Appl. No.: 10/068,864

(22) Filed: Feb. 11, 2002

(65) Prior Publication Data

US 2002/0131731 A1 Sep. 19, 2002

(30) Foreign Application Priority Data

Mar. 16, 2001 (JP) ........................................ 2001-075390

(51) Int. Cl.[7] .............................. G02B 6/36; H01S 3/04
(52) U.S. Cl. .............................. 385/92; 385/88; 385/93; 372/34; 372/36
(58) Field of Search ............................. 385/92, 93, 83, 385/91, 33, 88; 372/34, 36, 6

(56) References Cited

U.S. PATENT DOCUMENTS

| | | | | |
|---|---|---|---|---|
| 5,265,113 A | * | 11/1993 | Halldorsson et al. | ......... 372/35 |
| 5,371,753 A | * | 12/1994 | Adsett | ......... 372/35 |
| 6,252,726 B1 | * | 6/2001 | Verdiell | ......... 372/34 |
| 6,496,524 B2 | * | 12/2002 | Miyokawa et al. | ......... 372/36 |
| 6,522,486 B2 | * | 2/2003 | Furuhashi | ......... 385/88 X |

FOREIGN PATENT DOCUMENTS

JP     5-167143 A  *  7/1993  ............. H01S/3/18

* cited by examiner

Primary Examiner—Phan T. H. Palmer
(74) Attorney, Agent, or Firm—Oblon, Spivak, McClelland, Maier & Neustadt, P.C.

(57) ABSTRACT

In a light source comprising a plurality of laser diode modules, high optical power is outputted, while these laser diode modules are arranged in high density. The light source is arranged by employing a plurality of laser diode modules, the optical power of which is higher than, or equal to 300 mW.

13 Claims, 5 Drawing Sheets

FIG. 2A
FIG. 2B
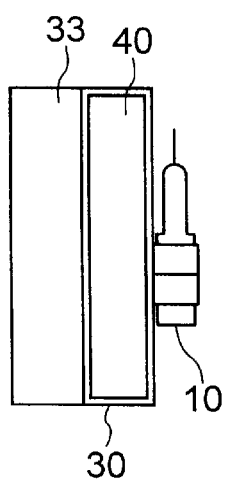
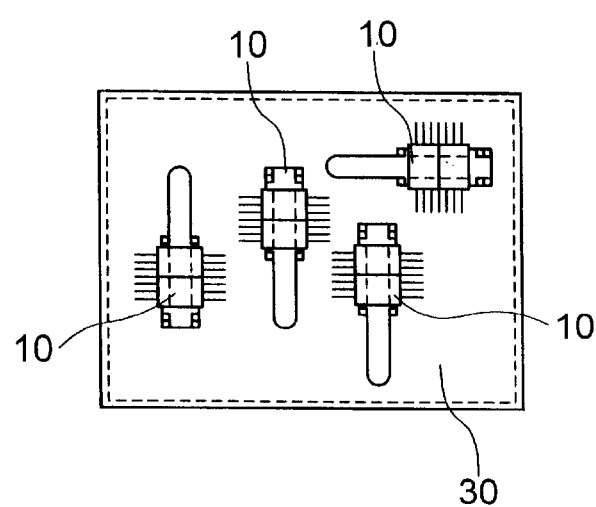

LIGHT SOURCE HAVING PLURAL LASER DIODE MODULES

FIELD OF THE INVENTION

The present invention generally relates to a high power light source. More specifically, the present invention is directed to a light source comprising a plurality of laser diode modules having high optical power and arranged in high density.

DESCRIPTION OF THE RELATED ART

Normally, laser diode modules are employed as signal light sources of optical fiber communications, especially, signal light sources of main trunk systems/CATV systems, and light-excitation light sources of fiber amplifiers. In such a laser diode module, a Peltier-effect element is built therein, and various optical components and various electronic components are arranged on a metal substrate mounted on the Peltier-effect element in order to realize high optical power and stable operations of the laser diode module. The optical components are a laser diode chip, a photodiode chip, a lens, and the like whereas, the electronic components are a thermistor element, an inductor, a resistor, and the like.

It should be noted that the above-explained Peltier-effect element is a thermocouple semiconductor. In the case that the Peltier-effect element is made from a p-type semiconductor, when a DC current is supplied to the Peltier-effect element, heat is moved along the current flowing direction. In the case that the Peltier-effect element is made from an n-type semiconductor, when a DC current is supplied thereto, heat is moved along a direction opposite to the current flowing direction, so that a temperature difference is produced between both ends of the thermocouple semiconductor. In a cooling system using such a Peltier-effect element, a low-temperature side thereof is used for cooling, and a high-temperature side thereof is used for heat dissipation, while utilizing the above-explained temperature difference.

In the laser diode module, a temperature of the above-explained laser diode chip is detected by the thermistor element positioned in the vicinity of the laser diode chip. The laser diode module includes the following structure which is capable of keeping the temperature of the laser diode chip constant. That is, the thus detected value of the temperature is fed back so as to drive the Peltier-effect element, so that the entire metal substrate where the laser diode chip is arranged is cooled.

FIG. 5 depicts a conventional laser diode module. FIG. 5 is a sectional view for schematically showing the conventional laser diode module. As shown in FIG. 5, the laser diode module includes a mount 113 for mounting thereon both a laser diode chip 111 and a heat sink 112, a chip carrier 115 for mounting thereon a monitoring photodiode chip 114, a lens holder 116, a metal substrate 110a for mounting thereon a resistor, an inductor, and a circuit board (not shown); and a Peltier-effect element 117. The Peltier-effect element 117 is fixed on a heat dissipating plate 118 of a package by metal solder. It should also be noted that ceramics plates 119A and 119B are arranged on upper and lower portions of a Peltier-effect element 117.

FIG. 6 is a sectional view for showing the laser diode module, taken along a line A to A' in FIG. 5. As shown in FIG. 6, as an essential portion of the laser diode module, a thermistor 121 and the laser diode chip 111 are mounted on the heat sink 112. As a metal solder used to adhere the Peltier-effect element 117 to the metal substrate 110a, soft solder 122 is employed in order to relax a thermal expansion difference between the two members.

The above-explained metal substrate is in general made of a single material such as copper tungsten (CuW: weight distribution ratio of copper is 10% to 30%). When the metal substrate is adhered to the Peltier-effect element, low-temperature soft solder such as indium tin (InSn) is employed so as to relax the thermal expansion difference between the two materials.

However, recently, more severe requests are made with respect to both the cooling capability of the laser diode module, and the temperature environmental reliability (namely, capability of maintaining normal functions under the condition even when temperature varies).

At first, in order to improve the cooling capability, the size of the Peltier-effect element should be made large, and also the metal substrate mounted on the upper portion thereof must be made from the high heat transfer material. Since the temperature adjusting time (namely, time duration until target temperature is reached) is reduced due to improvements in the cooling capability of the Peltier-effect element, the temperature stress given to the metal substrate mounted on the Peltier-effect element is also increased. As a result, the adverse influence given by the difference of the heat expansion coefficients between the Peltier-effect element and the metal substrate is increased. As a result, there is such a problem that cracks and exfoliation will occur, because the soft solder used to adhere the both members is slid. Moreover, since the soldering creep phenomenon which is specific to the soft solder becomes apparent, such a low-temperature hard solder as bismuth tin (BiSn) must be employed as the solder for adhering the Peltier-effect element to the metal substrate.

To solve the above-explained problem, Japanese Patent Provisional Publication No. Hei 10-200208 discloses a semiconductor laser module including a metal substrate made of two different kinds of metal materials. FIG. 7 schematically shows a conceptional structure of the semiconductor laser module. As shown in FIG. 7A, the semiconductor laser module is manufactured as follows: a metal substrate 210 is adhered to a Peltier-effect element 207 with ceramics boards 209A and 209B mounted on upper and lower surfaces thereof by using hard solder 212. An LD chip 201 and a thermistor 211 are mounted on the metal substrate 210 through a heat sink 202 and a sub-mount 203 together with a lens of an optical system. The thermistor 211 is employed so as to keep the temperature of the LD chip 201 constant.

The metal substrate 210 is adhered onto the upper surface of the Peltier-effect element 207 in such manner that a heat flow derived from the LD chip 201 directed to the Peltier-effect element 207 is in perpendicular thereto. In particular, the metal substrate 210 is formed in such a manner that a first metal member 213 is arranged at a center portion of the substrate including a portion located directly below the LD 201, and a second metal member 214 is arranged so as to surround the first metal member. Furthermore, as depicted in FIG. 7B, the metal substrate 210 is manufactured in such a manner that the first metal member 213 is formed by such a metal member having a large heat conductivity, whereas the second metal member 214 is made of such a metal member having a heat expansion coefficient smaller than that of the first metal member 213.

In other words, it is expected that since the above-explained metal substrate 210 is employed, the heat expansion of the entire metal substrate can be reduced, the heat condution thereof can be improved so as to increase the cooling performance. At the same time, it is expected that reliability of the Peltier-effect element is improved.

It should also be noted that in general, a plurality of laser diode modules functioning as a light output source are mounted on either the light-excitation light source or the optical-signal light source. A laser diode module is combined with other optical components so as to be used in an optical amplifier.

In accordance with the above-explained prior art, it is so expected that the cooling performance of the Peltier-effect element may be improved and also the reliability of the Peltier-effect element may be increased in each of the laser diode modules. However, in the case that the respective laser diode modules output higher optical power, and also a large number of such high-power laser diode modules are arranged in high density to be driven, the resulting heat generated from the high-power laser diode modules arranged in high density could not be properly treated by merely increasing the heat conducting property of the metal substrate which is arranged between the chip and the Peltier-effect element, or by merely reducing the difference in the heat expansion coefficient. As a result, there is another problem that the functions of the laser diode module would be damaged.

More specifically, since the size of each of these laser diode modules per se is small, but a high density heat generator, when a plurality of these laser diode modules are required to be mounted as either the light-excitation light source or the optical-signal light source, it is practically difficult to dissipate heat from the laser diode modules. On the other hand, further improvements in high light output power are needed in either the light-excitation light source or the light-signal light source. In the conventional method, there is a limitation in the cooling effect achieved by the Peltier-effect element of the laser diode module. As a result, the laser diode modules could be used only under such a condition that the performance of the semiconductor element remains far below 100%.

Furthermore, even when the optical power of the laser diode module is increased in response to needs of the market, there is a strong need that the power consumption caused by excitation of both the Peltier-effect element and the semiconductor element is required to be kept lower than that of the conventional art. Therefore, the heat dissipation property within the light source may become very important.

In addition to the laser diode module, another request is made of treating the heat generated by the laser diode module control board equipped with another heat generating element (for example, CPU) for controlling the laser diode module.

As previously explained, developments of either a light-excitation light source or an optical-signal light source, which is mounted on a heat sink having excellent heat dissipation, are strongly expected.

SUMMARY OF THE INVENTION

There is provided a light source having laser diode modules of the invention comprising a plurality of laser diode modules being arranged in high density, each of said laser diode modules having an optical power of at least 300 mW. More specifically, in a light source having laser diode modules of the invention, the light source comprises:

a plurality of laser diode modules, each of which includes a metal substrate and a Peltier-effect element thermally connected to said metal substrate, said metal substrate mounting thereon a laser diode chip and an optical appliance; and a mounting portion comprising one plate type heat pipe, on which said plurality of laser diode modules are mounted.

BRIEF DESCRIPTION OF THE DRAWINGS

For a better understanding of the present invention, reference is made of a detailed description to be read in conjunction with the accompanying drawings, in which:

FIGS. 2A and 2B are diagrams for illustratively showing a light source having plural laser diode modules according to an embodiment of the present invention;

DETAILED DESCRIPTION OF THE PREFERRED EMBODIMENTS

Figure 1:
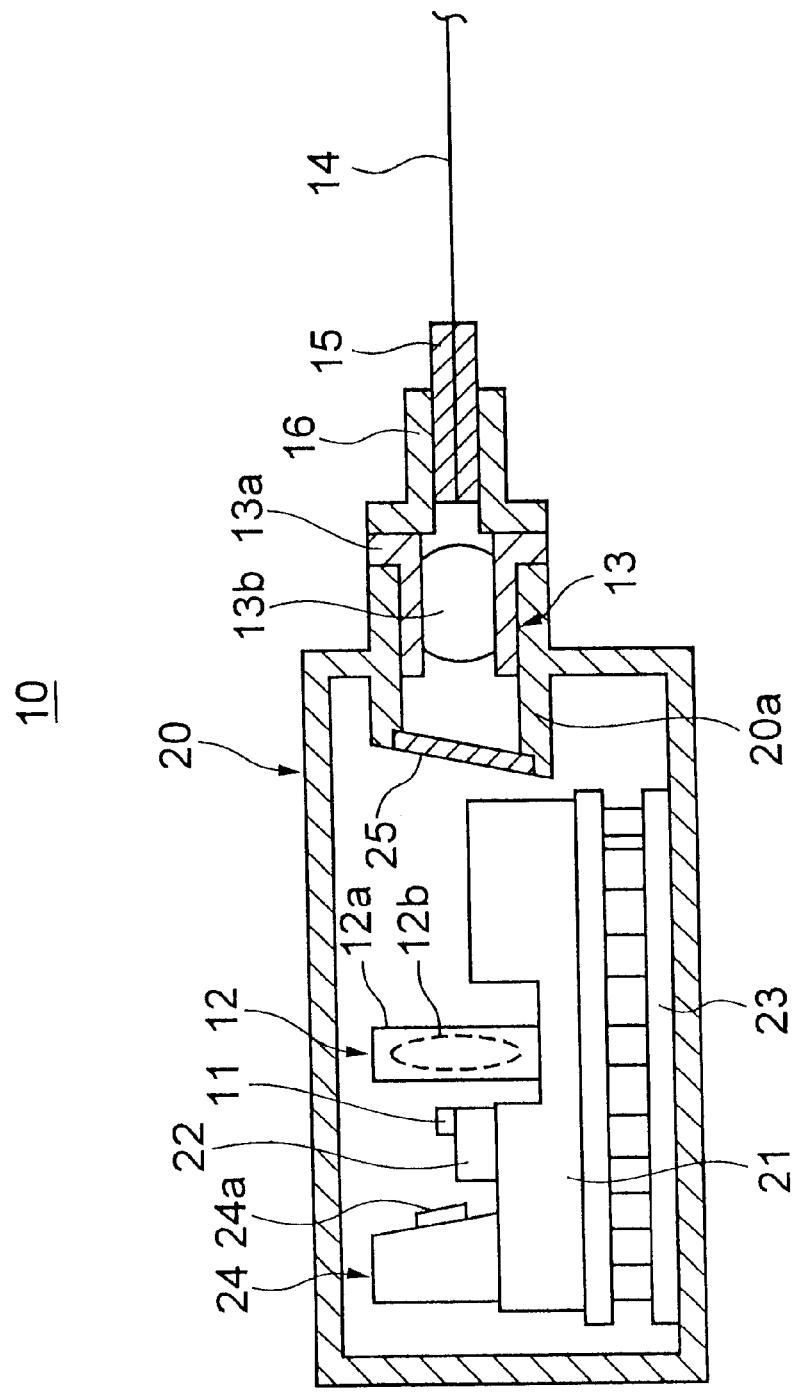
FIG. 1 is a diagram for schematically showing one structural example of each of laser diode modules which constitute a light source according to the present invention.

With Reference to drawings, various embodiments of a light source having laser diode modules of the present invention will be described in detail.

An object of the present invention is to provide a light source including a plurality of laser diode modules arranged in high density, capable of outputting high optical power.

The inventors of the present invention have made an intensive study to solve the above-explained problems of the prior art, and found the followings. When a heat pipe having a heat conductivity which is at least about 20 times larger than a heat conductivity of monocrystal diamond is connected to a Peltier-effect element, a risk that the Peltier-effect element is destroyed could be considerably reduced. The heat pipe connecting method has been conventionally disliked and refused by users due to the following reasons. It has been thought that since a fluid called as a "working fluid" is contained in the heat pipe, an adverse influence, which is caused by leakage and humidity of this working fluid, may be supposed to occur. Therefore, such a working fluid is not wanted to be used in a highly precise appliance such as a laser diode module. However, the inventors could come to recognize such a fact that the resulting laser diode modules can output high optical power, and also these laser diode modules can be arranged in high density by using such a heat pipe.

In addition, the inventors could have the following findings. When a heat pipe, more specifically, a heat absorbing portion of a plate type heat pipe is thermally connected to a Peltier-effect element provided in each of laser diode modules, even if a large number of laser diode modules each having high optical output power are arranged in high density, then the respective laser diode modules can be cooled in not-comparable cooling degrees with respect to the conventional cooling performance. The laser diode modules are equipped with a metal substrate and the Peltier-effect elements thermally connected to this metal substrate on which a laser diode chip and an optical appliance are mounted. As a consequence, it is possible to provide a light source having a plurality of laser diode modules with high reliability and capable of outputting high optical power.

Moreover, a mounting portion on which the above-explained plural laser diode modules are mounted is manufactured by one plate type heat pipe, and also, round type heat pipe portions are extended along two directions from a rectangular main body portion of this plate type heat pipe, and in addition heat dissipating fins attached to the round type heat pipe portions. As a consequence, since heat may be transferred in a predetermined direction, a thickness of a light source can be made thin, and furthermore, a wider contact surface of the plate type heat pipe can be utilized. Therefore, a mounting direction and a mounting position on the mounting portion of a case on which a plurality of laser diode modules are mounted can be freely selected, resulting in increasing of a design freedom.

One embodiment of a light source having laser diode modules of the invention comprises a plurality of laser diode modules being arranged in high density, each of the laser diode modules having an optical power of at least 300 mW. In other embodiment of the light source having laser diode modules of the invention, the light source comprises: a plurality of laser diode modules, each of which includes a metal substrate and a Peltier-effect element thermally connected to the metal substrate, the metal substrate mounting thereon a laser diode chip and an optical appliance; and a mounting portion comprising one plate type heat pipe, on which the plurality of laser diode modules are mounted.

In addition, in other embodiment of the light source having laser diode modules of the invention, a heat absorbing portion of the plate type heat pipe is thermally connected to the Peltier-effect element. In addition, a laser diode module control board is thermally connected to a surface of the plate type heat pipe functioning as the mounting portion, the surface of the plate type heat pipe being located opposite to a surface thereof on which the plurality of laser diode modules are mounted.

In addition, in other embodiment, the plate type heat pipe comprises a main body portion having a rectangular shape, and at least one round type heat pipe portion which is extended from the rectangular main body portion and is integrally formed with the rectangular main body portion as a single member. The main body portion comprises a hollow construction having a cavity portion, the cavity portion of said main body portion being communicated with internal portions of the round type heat pipes.

In other embodiment, the round type heat pipe portions may be extended from the rectangular main body portions in one direction. The round type heat pipe portions may be extended from the rectangular main body portions along plural directions. Positions and directions to be arranged of the plural laser diode modules are selected in free choice. The first group of the round type heat pipe portions may be extended from the rectangular main body portions in one direction, and second group of the round type heat pipe portions may be extended from the rectangular main body portions in opposite direction to the one direction. Number of the first and second group of the round type heat pipe portions may be the same. Number of the first and second group of the round type heat pipe portions may be different from each other. In addition, in other embodiment, each of the round type heat portion may further includes heat dissipating fins.

FIG. 1 is a schematic diagram for representing one structural example of each of laser diode modules which constitute a light source of the present invention. As depicted in FIG. 1, the laser diode module 10 includes a semiconductor laser 11, a first lens 12, a second lens 13, a core-enlarged fiber 14, and a hermetical case (i.e., hermetically sealed case) 20. The semiconductor laser 11 is provided on a base 21 through a chip carrier 22, while keeping a preselected interval with respect to the first lens 12. The base 21 is arranged above a Peltier-effect element 23. The Peltier-effect element 23 is provided within the hermetical case 20, and is used to control temperatures. As to the base 21, an essential portion thereof is made of copper, and a portion where the first lens 12 is mounted is made of a composite member made of stainless steel. A carrier 24 is fixed on the base 21 in such a manner that the carrier 24 is located opposite to the first lens 12 with the chip carrier 22 sandwiched therebetween. A photo diode 24$a$ for monitoring is provided so as to face the semiconductor laser 11 of the chip carrier 22.

The collimator lens 12$b$ is held by a lens holder 12$a$ in the first lens 12. The lens holder 12$a$ is fixed on the base 21 by welding. In the collimator lens 12$b$, an aspheric lens is employed in order to achieve a high coupling efficiency. As to the second lens 13, a spherical lens 13$b$, the upper and lower portions of which are cut out, is held by a lens holder 13$a$. The lens holder 13$a$ is fixed in an insertion cylinder 20$a$ (which will be explained later) of the hermetically sealed case 20, while a position of the lens holder 13$a$ is adjusted within a plane located perpendicular to an optical axis.

As to the core-enlarged fiber 14, a tip-sided portion whose core is enlarged is obliquely polished and is inclined at an angle of 6 degrees with respect to the optical axis, and also a polished surface of the core-enlarged tip-sided portion is coated by an anti-reflection coating treatment. Then, the tip-sided portion is adhered inside a metal cylinder 15 so that this tip-sided portion of the core-enlarged fiber 14 may be protected. The metal cylinder 15 is fixed at an optimum position of an adjusting member 16 by welding. The metal cylinder 15 is positionally adjusted to the optimum position of the adjusting member 16 in such a way that the metal cylinder 15 is slid in forward and backward directions along the optical axis direction of the core-enlarged fiber 14 within the adjusting member 16, and is rotated around the optical axis.

FIGS. 2A and 2B are diagrams for illustratively depicting a light source having laser diode modules, according to one embodiment of the present invention. FIG. 2A is a sectional view for showing the light source having the laser diode modules according to one embodiment, and FIG. 2B is an upper view for representing the light source having the laser diode modules according to one embodiment.

As illustrated in FIG. 2A, in this embodiment, a mounting portion 30 on which a plurality of laser diode modules are mounted comprises a plate type heat pipe. The plate type heat pipe functioning as the mounting portion 30 is formed by such a metal having a superior heat transfer property such as copper, or aluminum. The plate type heat pipe is manufactured to be a hollow structure having a hermetically sealed cavity portion 40. A working fluid, which is adaptable to the material of the heat pipe, is filled into the cavity portion 40. The laser diode module 10 is directly arranged on one surface (namely, heat absorbing portion) of the plate type heat pipe. Since the wider rectangular surface of the plate type heat pipe may be utilized, both the arranging position and the arranging direction of the laser diode module 10 may be freely selected. A heat sink 33 such as a heat dissipating fin is thermally connected to the other surface of the plate type heat pipe. Since the plate type heat pipe may be directly employed as the mounting portion, the arranging density of the laser diode module may be increased as much as possible by means of superior heat transfer of the plate type heat pipe, as far as it can be physically arranged.

In general, a heat pipe is provided with a container having a hermetically sealed cavity portion, and a heat transfer is carried out by way of both phase transition and movement of a working fluid which is received in the cavity portion. Although a portion of the heat is directly transferred through a material of the container which constitutes the heat pipe, a major portion of the heat is transferred by way of both the phase transition and the movement of the working fluid.

On the heat absorption side of the heat pipe, on which a component to be cooled is mounted, the working fluid is evaporated by receiving the heat transferred through the material of the container which constitutes the heat pipe, and then, the vaporized working fluid is moved to the heat dissipation side of the heat pipe. On the heat dissipation side, the vaporized working fluid is cooled and returned back to the liquid phase state. The working fluid which has been returned to the liquid phase state is again moved to the heat absorption side. A large amount of heat may be quickly moved by way of both the above-mentioned phase transition and the movement of the working fluid.

Figure 3A:
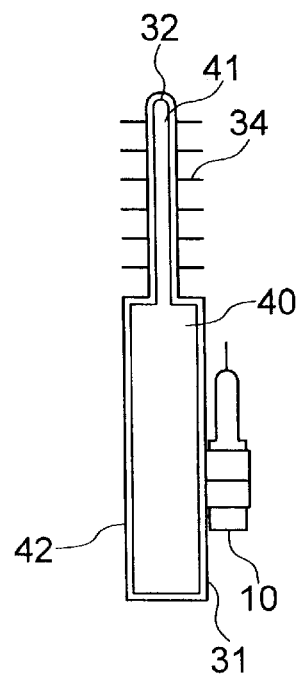
FIGS. 3A and 3B are diagrams for illustratively indicating a light source having plural laser diode modules according to another embodiment of the present invention.
Figure 3B:
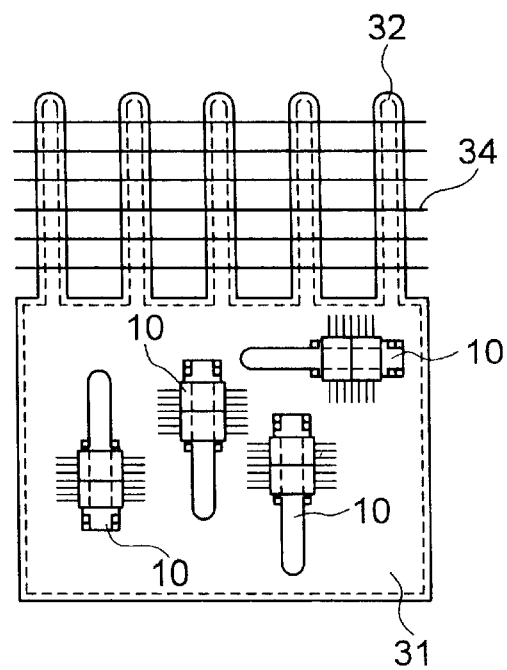

FIGS. 3A and 3B are diagrams for illustratively depicting a light source having laser diode modules, according to another embodiment of the present invention. FIG. 3A is a sectional view for showing the light source having the laser diode modules according to this embodiment, and FIG. 3B is an upper view for representing the light source having the laser diode modules according to this embodiment. In the light source having the laser diode modules according to this embodiment, a mounting portion comprises a main body portion 31 made of a rectangular plate type heat pipe, and round type heat pipe portions 32. The round type heat pipe portions 32 are extended from the main body portion 31, and are integrally formed with the main body portion 31 as a single member.

The main body portion 31 of the plate type heat pipe, which function as the mounting portion, and the round type heat pipe portions 32 are integrally formed as a single member by such a metal having a superior heat transfer characteristic such as copper and aluminum. The main body portion comprises a hollow construction having a cavity portion 40. The cavity portion 40 of the main body portion is communicated with internal portions 41 of the round type heat pipe portions. The laser diode module 10 is directly arranged on one surface (namely, heat absorption portion) of the plate type heat pipe. Also, in this embodiment, since a wider rectangular surface of the plate type heat pipe may be utilized, both the arranging position and arranging direction of the laser diode modules 10 may be freely selected. Heat dissipating fins 34 are attached to the round type heat pipe portions 32. In this embodiment, the heat generated from a plurality of laser diode modules is firstly transferred to the main body portion of the plate type heat pipe on which the laser diode modules are directly mounted, and is further transferred to both the cavity portion of the main body portion and the round type heat pipe portions whose inner portions are communicated with the cavity portion. Heat may be dissipated to a predetermined position by way of the heat dissipating fins attached to the round type heat pipe portions.

As explained above, in addition, in this embodiment, the surface 42 of the main body portion of the plate type heat pipe, which is located opposite to the surface 31 on which the laser diode modules 10 are mounted, may also be used as the heat absorbing portion of the heat pipe. In other words, a laser diode module control board or the like may be thermally connected to the surface. The laser diode module control board controls the laser diode modules, and mounts thereon other heat generation element (for instance, CPU, DSP (Digital Signal Processor), FET(Field Effect Transistor). In this case, a proper heat pipe is selected by considering a maximum heat transfer amount of a heat pipe to be used, the heat generating amount of the laser diode modules, and also the heat generating amount of the laser diode module control board or the like. As a result, the heat dissipation can be effectively carried out, and thus, the functions of the laser diode modules which are capable of outputting high optical power and are arranged in high density can be sufficiently realized.

Figure 4:
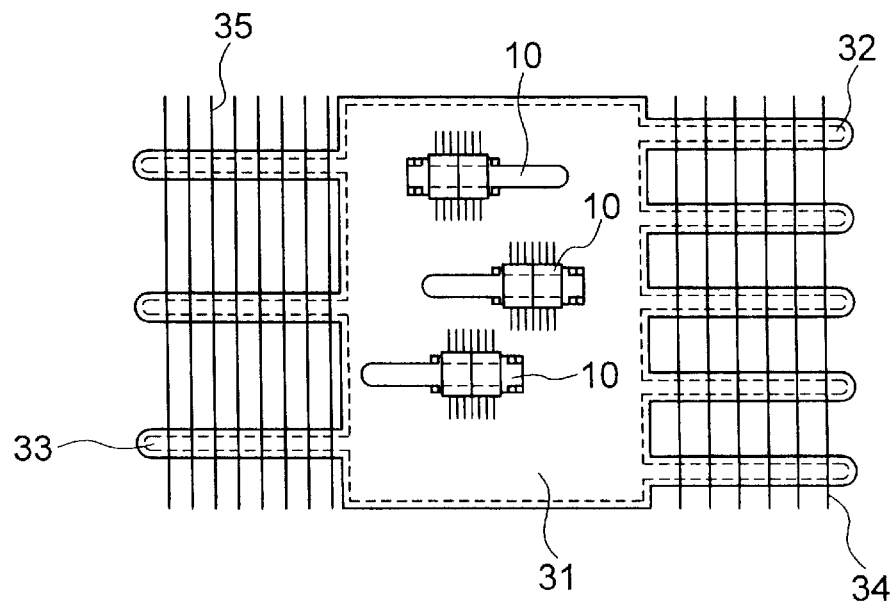
FIG. 4 is a top view for illustratively representing a light source having plural laser diode modules according to further another embodiment of the present invention.
Figure 5:
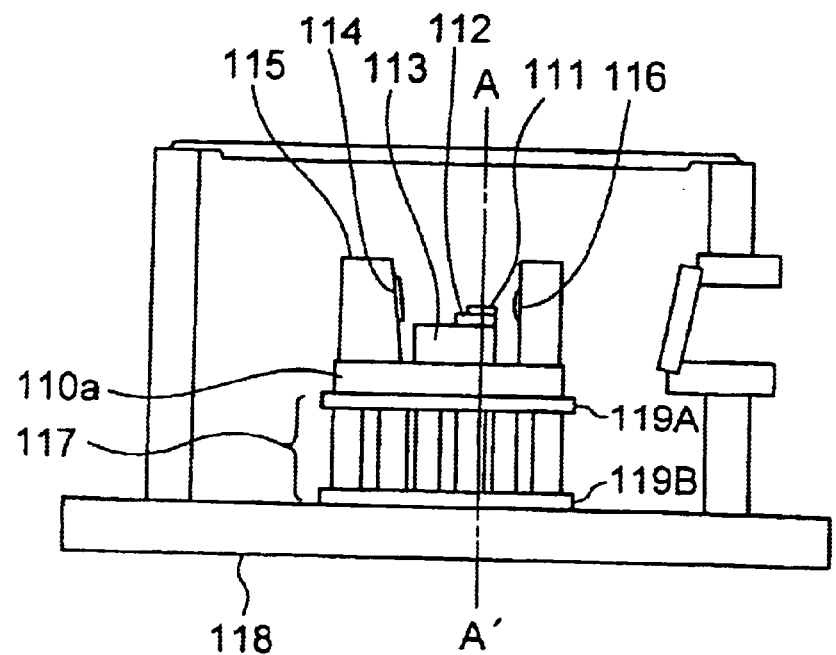
FIG. 5 is a diagram for indicating the conventional laser diode module.
Figure 6:
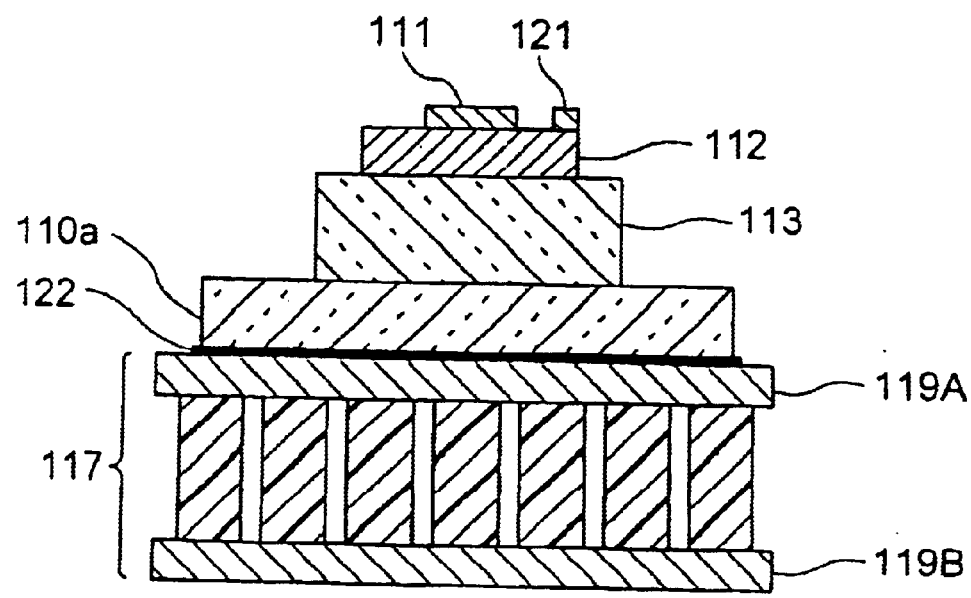
FIG. 6 is a sectional view of the laser diode module, taken along a line A to A' of FIG. 5.
Figure 7A:
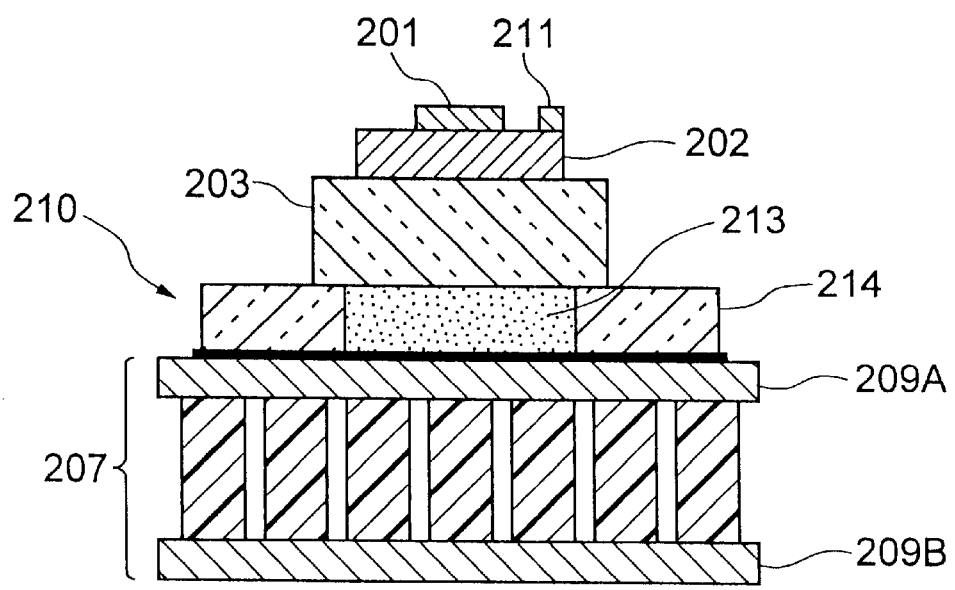
FIGS. 7A and 7B are diagrams for illustratively indicating the semiconductor laser module equipped with the metal substrate comprising two kinds of metal materials.
Figure 7B:
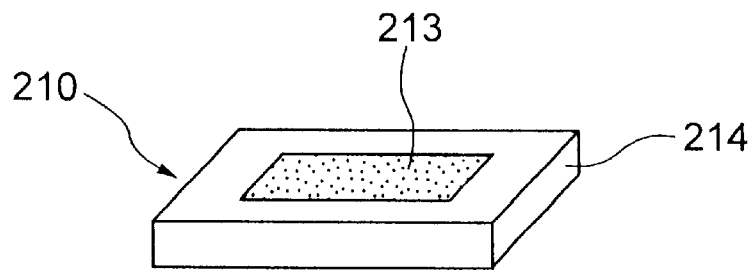

FIG. 4 is an upper view for illustratively showing a light source having laser diode modules, according to another embodiment of the present invention.

In the light source having the laser diode modules according to this embodiment, a mounting portion comprises a main body portion 31 of a rectangular plate type heat pipe, and two sets of round type heat pipe portions 32 and 33. These two round type heat pipe portions 32 and 33 are extended in opposite directions from the main body portion 31, and are integrally formed with the main body portion 31 as a single member.

The main body portion 31 of the plate type heat pipe, and the rounded type heat pipe portions 32, 33, which function as the mounting portions, are formed in an integral manner by employing such a metal having a superior heat transfer property such as copper and aluminum. The main body portion 31 comprises a hollow construction having a cavity portion. The cavity portion of the main body portion 31 is communicated with internal portions 41 of the round type heat pipes 32, 33. The laser diode modules 10 are directly arranged on one surface (namely, heat absorption portion) of the plate type heat pipe. In this drawing, however, the laser diode modules 10 are arranged in parallel to the round type heat pipes 32 and 33. Also, in this embodiment, since a wider rectangular surface of the plate type heat pipe may be utilized, both the arranging position and arranging direction of the laser diode modules 10 may be freely selected. Heat dissipating fins 34 and 35 are attached to each of the round type heat pipe portions 32 and 33. In this embodiment, the heat generated from a plurality of laser diode modules is firstly transferred to the main body portion 31 of the plate type heat pipe on which the laser diode modules are directly mounted, and is further transferred to the round type heat pipe portions 32, 33 whose inner portions are communicated with the cavity portion of the main body portion 31. Heat may be dissipated to a predetermined position by way of the heat dissipating fins attached to the round type heat pipe portions 32, 33.

As explained above, in addition, also in this embodiment, the surface (not shown) of the main body portion of the plate type heat pipe, which is located opposite to the surface 31 on which the laser diode modules 10 are mounted, may also be used as the heat absorbing portion of the heat pipe. In other words, a laser diode module control board or the like may be thermally connected to the surface. The laser diode module control board controls the laser diode modules, and mounts thereon other heat generation element (for instance, CPU). In this embodiment, since the two round type heat pipe portions 32 and 33 are extended in opposite directions from the main body portion 31, and are integrally formed with the main body portion 31 as a single member, a larger amount of heat can be effectively transferred. Also in this case, a proper heat pipe is selected by considering a maximum heat transfer amount of a heat pipe to be used, the heat generating amount of the laser diode modules, and also the heat generating amount of the laser diode module control board or the like. As a result, the heat dissipation can be effectively carried out, and thus, the functions of the laser diode modules which are capable of outputting high optical power and are arranged in high density can be sufficiently realized.

In the light source having the laser diode modules according to the present invention, in order to realize the function of the laser diode modules sufficiently, the temperature at the side of the mounting portion of Peltier-effect elements may be up to about 70° C. so as to maintain the temperature in the vicinity of the photo diode of the laser diode module to be up to about 25° C. Then, it is preferable that the heat transfer amount of the heat pipe is selected so as to maintain the temperature described above.

The connection between the laser diode modules and the mounting portion comprising the plate type heat pipe is carried out in such a manner that the heat resistance may be decreased. That is, the laser diode modules are closely connected to the mounting portion by way of junction, mechanical jointing or the like in such manner that the bottom portion of the laser diode modules 10 are directly made in contact with the surface of the mounting portion 31. Alternatively, in order to reduce the heat resistance, the laser diode modules may be directly made in contact with the mounting portion through a thermal interface sheet, or a thermal grease.

As a consequence, optical power outputted from each of the laser diode modules can be furthermore increased. Moreover, even when the laser diode modules capable of outputting such high optical power are arranged in high density, heat of the laser diode modules can be effectively dissipated, and temperatures of the laser diode modules can be maintained within a predetermined temperature range, while the Peltier-effect elements arranged within the laser diode modules are not only destroyed, but also the performance of the laser diode chip 11 is not deteriorated. Accordingly, the performance of the light source can be maintained.

The internal portion of the mounting portion is brought into a reduced pressure condition, and such a working fluid as water, substituted flon, florinate, is filled into the internal portion by considering adaptability between the material of the mounting portion and the working fluid. Preferably, while both the main body portion of the plate type heat pipe and the round type heat pipe portion are constituted by employing such a heat pipe made of copper, water may be used as the working fluid. To easily circulate the working fluid, a wick may be arranged within the heat pipe. The shape of the plate type heat pipe is not limited to the rectangular shape, but various shapes may be employed when a wide contact surface of such modified shape can be maintained. The shape of the round type heat pipe portion may be selected from a circular shape, an ellipse shape, a flattened oval or the like.

The light source having the laser diode modules, according to the present invention, may be used as a light excitation light source employed in an optical transfer system. Furthermore, the light source having the laser diode modules, according to the present invention, may be employed as a light source of an optical signal used in an optical transfer system.

Furthermore, a Raman amplifier, according to the present invention, is a Raman amplifier with employment of the light source comprising the laser diode module according to the present invention.

A light source of the invention having the plural laser diode modules is explained in detail by examples.

EXAMPLE 1

As depicted in FIGS. 2A and 2B, a mounting portion comprising a plate type heat pipe having a cavity portion was manufactured, and the plate type heat pipe is made of copper in sizes of 100 mm (length), 200 mm (width), and 7 mm (height). A bottom portion of laser diode modules was directly made in close-contact with such a portion of one surface of the mounting portion, on which the laser diode modules were arranged, through heat transfer grease.

A corrugated fin having a height of 20 mm and a pitch of 3 mm was metallic-joined to the opposite surface (namely, button surface side) to the surface of the mounting portion on which 6 sets of laser diode modules were arranged at random by way of the blazing process (soldering process), as explained above.

The optical power outputted from each of the six laser diode modules arranged in the random manner was at least 100 mW.

Water is filled into the heat pipe as the working fluid, and a wire-shaped wick is arranged inside the heat pipe.

When the light source having the laser diode modules manufactured in the above-explained manner, according to the present invention, is operated, such high optical power of 300 mW was obtained from the light source, and the temperature of the laser diode modules was maintained within a range from 24.9° C. to 25.1° C.

As explained above, since the bottom portion of the laser diode modules are arranged in such a manner that the laser diode modules are directly made in contact with the plate type heat pipe, high heat dissipating property was achieved. As a consequence, either a compact light-excitation light source or a compact optical-signal light source can be realized, while both the high optical power and the low power consumption can be maintained.

EXAMPLE 2

As depicted in FIG. 3, there was prepared a mounting portion comprising a main body portion made of a plate type heat pipe having a cavity portion, which was made of copper in sizes of 100 mm (length), 200 mm (width), and 7 mm (height), and round type heat pipe portions each having a diameter of 5 mm and a length of 100 mm, which were integrally formed with the main body portion, and internal portions of the round type heat pipe portions were communicated with the cavity portion of the plate type heat pipe. Bottom portions of laser diode modules were directly made in close-contact with portions of one surface of the mounting portion, on which the laser diode modules were arranged, through heat transfer grease.

As shown in FIG. 3, a plate type heat dissipation fin designed by 200 mm (length), 40 mm (width), and 0.3 mm (thickness) was attached to heat dissipating portions of the round type heat pipe portions which were extended from the main body portion on which the six sets of laser diode modules were arranged at random, as described above.

It should also be understood that the optical power outputted from each of the six laser diode modules arranged in the random manner was at least 100 mW.

Water is filled into the heat pipe as the working fluid, and a wire-shaped wick is arranged inside the heat pipe.

When the light source having the laser diode modules manufactured in the above-explained manner, according to the present invention, is operated, such high optical power of 400 mW was obtained from the light source, and the temperature of the laser diode modules was maintained within a range from 24.9° C. to 25.1° C.

As previously explained, since the bottom portions of the laser diode modules are arranged in such a manner that the laser diode modules are directly made in contact with the main body portion of the plate type heat pipe, and further, the heat dissipation is carried out by the heat dissipating fins attached to the round type heat pipe portions which are extended from the main body portion, high heat dissipating property was achieved. As a consequence, either a compact light-excitation light source or a compact optical signal light source can be realized, while both the high optical power and the low power consumption can be maintained.

EXAMPLE 3

As depicted in FIG. 4, there was prepared a mounting portion comprising a main body portion made of a plate type heat pipe having a cavity portion, which was made of copper in sizes of 100 mm (length), 200 mm (width), and 7 mm (height), and two groups of round type heat pipe portions each having a diameter of 5 mm and a length of 100 mm. Each group of the round type heat pipe portions are extended along opposite directions, which are integrally formed with the main body portion, and internal portions of the two groups of round type heat pipe portions are communicated with the cavity portion of the plate type heat pipe. Bottom portions of laser diode modules were directly made in close-contact with portions of one surface of the mounting portion, on which the laser diode modules were arranged, through thermal grease.

As shown in FIG. 4, a plate type heat dissipation fin designed by 200 mm (transverse direction), 40 mm (longitudinal direction), and 0.3 mm (thickness) was attached to heat dissipating portions of each of the two groups of round type heat pipe portions which were extended from the main body portion on which the six sets of laser diode modules were arranged at random, as described above.

It should also be understood that optical power outputted from each of the six laser diode modules arranged in the random manner on the mounting portion was at least 100 mW.

Water is filled into the heat pipe as the working fluid, and a wire-shaped wick is arranged inside this heat pipe.

When the light source having the laser diode modules manufactured in the above-explained manner, according to the present invention, is operated, such high optical power of 450 mW was obtained from the light source, and the temperature of the laser diode modules was maintained within a range from 24.9° C. to 25.1° C.

As previously explained, since the bottom portion of the laser diode modules are arranged in such a manner that these laser diode modules are directly made in contact with the main body portion of the plate type heat pipe, and further, the heat dissipation is carried out by the heat dissipating fins attached to the two round type heat pipes which are extended from the main body portion along the opposite direction, high heat dissipating property was achieved. As a consequence, either a compact light-excitation light source or a compact optical-signal light source can be realized, while both the high optical power and the low power consumption can be maintained.

As previously described in detail, in accordance with the present invention, it is possible to provide such a slim light source manufactured by a plurality of laser diode modules capable of outputting high optical power. These laser diode modules can be arranged within the light source in high density and also with high degree of freedom. Accordingly, the compact light-excitation light source, or the compact optical-signal light source can be provided, while such high optical power and the low power consumption can be maintained, resulting in higher industrial utilization values.

What is claimed is:

1. A light source having laser diode modules comprises a plurality of laser diode modules being arranged in high density, each of said laser diode modules having an optical power of at least 300 mW.

2. A light source having laser diode modules as claimed in claim 1, wherein said light source comprises:

a plurality of laser diode modules, each of which includes a metal substrate and a Peltier-effect element thermally connected to said metal substrate, said metal substrate mounting thereon a laser diode chip and an optical appliance; and a mounting portion comprising one plate type heat pipe, on which said plurality of laser diode modules are mounted.

3. A light source having laser diode modules as claimed in claim 2, wherein a heat absorbing portion of said plate type heat pipe is thermally connected to said Peltier-effect element.

4. A light source having laser diode modules as claimed in claim 3, wherein a laser diode module control board is thermally connected to a surface of said plate type heat pipe functioning as said mounting portion, said surface of the plate type heat pipe being located opposite to a surface thereof on which said plurality of laser diode modules are mounted.

5. A light source having laser diode modules as claimed in claim 4, wherein said plate type heat pipe comprises a main body portion having a rectangular shape, and at least one round type heat pipe portion which is extended from the rectangular main body portion and is integrally formed with said rectangular main body portion as a unit.

6. A light source having laser diode modules as claimed in claim 5, wherein said main body portion comprises a hollow construction having a cavity portion, said cavity portion of said main body portion being communicated with internal portions of said round type heat pipes.

7. A light source having laser diode modules as claimed in claim 5, wherein said round type heat pipe portions are extended from said rectangular main body portions in one direction.

8. A light source having laser diode modules as claimed in claim 5, wherein said round type heat pipe portions are extended from said rectangular main body portions along plural directions.

9. A light source having laser diode modules as claimed in claim 7, wherein positions and directions to be arranged of said plural laser diode modules are selected in free choice.

10. A light source having laser diode modules as claimed in claim 7, wherein first group of said round type heat pipe portions are extended from said rectangular main body portions in one direction, and second group of said round type heat pipe portions are extended from said rectangular main body portions in opposite direction to said one direction.

11. A light source having laser diode modules as claimed in claim 10, wherein number of said first and second group of said round type heat pipe portions is the same.

12. A light source having laser diode modules as claimed in claim 10, wherein number of said first and second group of said round type heat pipe portions is different from each other.

13. A light source having laser diode modules as claimed in any one of claims 2 to 12, wherein each of said round type heat portion further includes heat dissipating fins.

* * * * *